United States Patent [19]

Moriwaki et al.

[11] Patent Number: 4,608,541

[45] Date of Patent: Aug. 26, 1986

[54] ISOLATION AMPLIFIER

[75] Inventors: Ikuo Moriwaki; Shinji Taniguchi, both of Tokyo, Japan

[73] Assignee: Analog Devices, KK, Tokyo, Japan

[21] Appl. No.: 736,653

[22] Filed: May 21, 1985

[30] Foreign Application Priority Data

Aug. 10, 1984 [JP] Japan .................................. 59-168190
Oct. 8, 1984 [JP] Japan .................................. 59-210670

[51] Int. Cl.$^4$ ......................... H03F 3/38; H03F 3/217
[52] U.S. Cl. ................................. 330/10; 330/207 A; 330/251
[58] Field of Search ..................... 330/10, 207 A, 251, 330/9, 51

[56] References Cited

U.S. PATENT DOCUMENTS

3,430,125 2/1969 Povenmire et al. .................. 330/10
3,466,557 9/1969 Nazareth ............................... 330/10
3,899,745 8/1975 Fletcher et al. ..................... 330/251

Primary Examiner—Eugene R. LaRoche
Assistant Examiner—Steven J. Mottola
Attorney, Agent, or Firm—Parmelee, Bollinger & Bramblett

[57] ABSTRACT

The invention comprises an isolation amplifier including an input circuit and an output circuit coupled through an isolation transformer. A switching type balanced modulator modulates a square wave carrier with an analog signal input and delivers the resulting signal to the input of the isolation transformer. A demodulator in the output circuit inverts alternate points of the modulated square wave carrier to essentially reproduce the analog input. A sample and hold capacitor circuit connected to the output of the demodulator fills the gap between the trailing and leading edges of successive pulses.

13 Claims, 10 Drawing Figures

ISOLATION AMPLIFIER

BACKGROUND OF THE INVENTION

1. Field of the Invention

The present invention relates to an isolation amplifier utilizing transformer coupling.

2. Description of the Prior Art

In various fields such as industrial process control systems, medical measurements, and the like, isolation amplifiers are used for coupling sensors to signal processors. In one such type of isolation amplifier, a modulated carrier signal is supplied to the primary winding of an isolation transformer. A secondary winding output signal is demodulated in synchronism with the input carrier to detect the analog input.

A double-balanced modulation method is known wherein positive and negative amplitude modulated pulses are supplied to the primary winding transformer in response to transmission signals. This method has the advantage of not requiring a rectification smoothing circuit or a low-pass filter (carrier suppressor), resulting in very wide band transmission characteristics. The pulse modulator may be of the switching type driven by the carrier pulse. Bipolar or field effect transistors (FET) are most commonly employed as the switching elements in integrated devices.

When transistors are used as switching elements of the modulator as described above, their ON resistance of several hundred ohms, combines with the inductance of the isolation transformer's primary winding to create an LR time constant which results in a time delay of the leading and trailing edges of the transmitted signal. When this signal is rectified, the resulting signal is discontinuous. Carrier noise (or carrier leakage) results at each gap between the leading and trailing edges of the carrier pulses. In order to control such carrier leakage, a low-pass filter must be connected to the output of the demodulator. However, this results in low frequency response, narrow transmission range, and poor linearity.

Accordingly, it is an object of the present invention to provide an isolation amplifier wherein carrier leakage in the output can be prevented without the need of a low-pass filter.

Another object is to provide such an isolation amplifier which has wide range transmission characteristics, low distortion, and high precision.

Another object is to provide such an amplifier which efficiently removes carrier leakage.

Other and further objects, features and advantages of the invention will appear more fully from the following description.

SUMMARY OF THE INVENTION

In accordance with a preferred embodiment of the present invention, a switching type balanced modulator supplies a modulated square wave carrier signal to the primary winding of an isolation transformer. A demodulator rectifies the output of the isolation transformer, essentially by multiplying respective positive and negative pulses by +1 and −1. A holding capacitor is connected to the output of the demodulator for filling in the signal gaps between the leading and trailing edges of the rectified pulses.

DETAILED DESCRIPTION OF THE PREFERRED EMBODIMENTS

Figure 1:
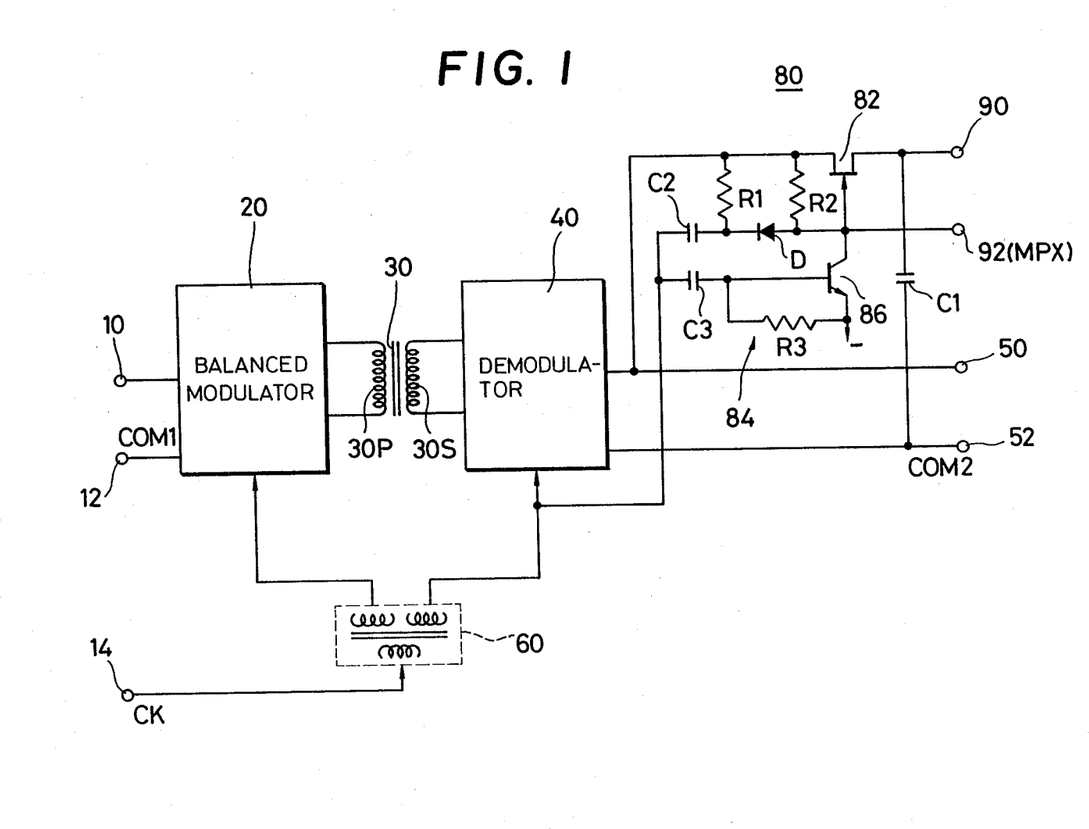
FIG. 1 is a circuit diagram of an isolation amplifier in accordance with a first embodiment of the present invention.
Figure 2A:
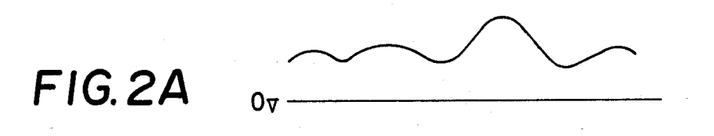
FIGS. 2A to 2C illustrate waveforms of signals in the circuit of FIG. 1.
Figure 2B:
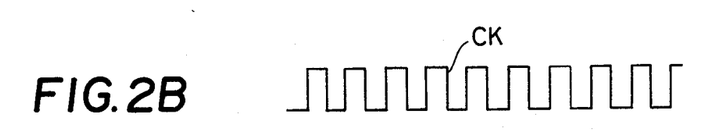
Figure 2C:
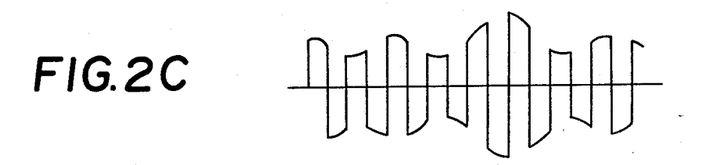

An analog signal such as shown in FIG. 2A is supplied to the input terminal 10 of the balanced modulator 20 of FIG. 1 where it is employed to double-balance modulate the square wave signal shown in FIG. 2B derived from a carrier clock CK connected to terminal 14. The modulated signal shown in FIG. 2C is applied to the primary winding 30P of an isolation transformer 30.

Figure 3A:
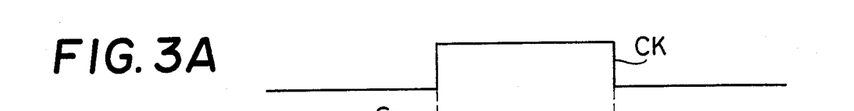
FIGS. 3A to 3D illustrate waveforms of other signals produced in the circuit of FIG. 1.
Figure 3B:
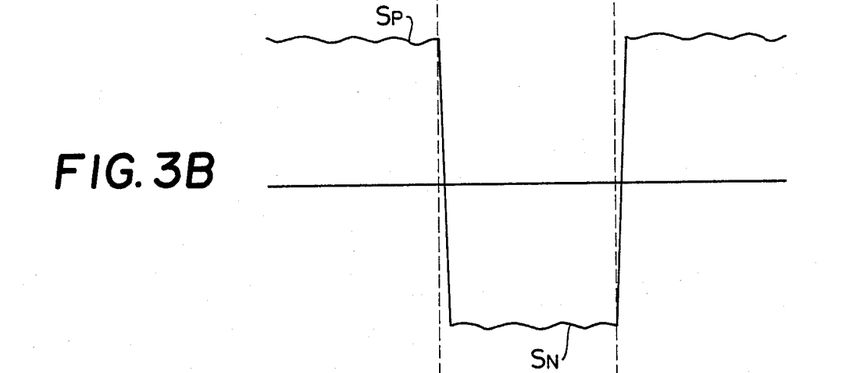
Figure 3C:
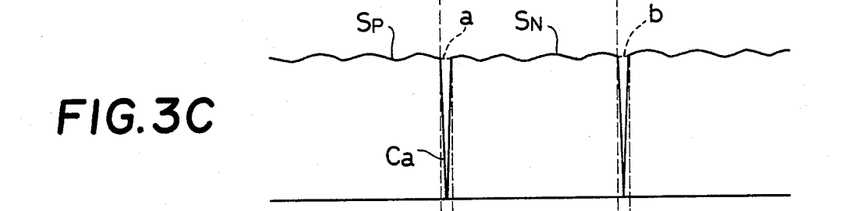

The output signal from the secondary winding 30S of isolation transformer 30 as illustrated in FIG. 3B is supplied to the input of a demodulator 40. As illustrated in FIG. 3C the modulated positive pulses $S_P$ from the transformer 30 are unchanged in polarity but the negative pulses $S_N$ are inverted. The resulting rectified pulses $S_P$, $S_N$ are supplied to a first output terminal 50. The common carrier clock signal CK is supplied to modulator 20 and demodulator 40 through a distribution transformer 60.

The modulator 20 and the demodulator 40 are of the switching type and preferably utilize a switching element such as a field effect transistor (FET). The ON resistance of such an element is several hundred ohms. This, together with the inductance of the primary winding 30P of the transformer 30, forms an LR time constant circuit. As a result, a time delay occurs at the leading and trailing edges of the output pulses from secondary windings 30S as illustrated in FIG. 3B. Upon demodulation of the transformer output, carrier noise or "leakage" Ca is generated at the leading and trailing edges.

A suppression or "de-glitch" circuit 80 for suppressing the carrier leakage Ca is connected to the output of demodulator 40. The suppression circuit 80 comprises an FET 82 as a sample-and-hold switch between the output of the demodulator 40, an output terminal 90, and a holding capacitor C1. Capacitor C1 is connected between an output of FET 82 and a common line COM2 connected to ground terminal 52. The FET 82 is controlled to be OFF for a predetermined period of time at each of the leading and trailing edges of the carrier clock signal by means of a sample and hold pulse-forming circuit 84.

Pulse-forming circuit 84 comprises a transistor 86 the emitter and collector of which are coupled between the gate of the FET 82 and a negative power source. The carrier clock signal CK is supplied to the base of the transistor 86 through a first differentiating circuit consisting of a capacitor C3 and a resistor R3. The transistor 86 is normally held OFF and the FET 82 is held ON by a positive demodulation output signal supplied to its gate through the resistor R2. This permits the demodulation output signal to be supplied to the output terminal 90.

Figure 3D:
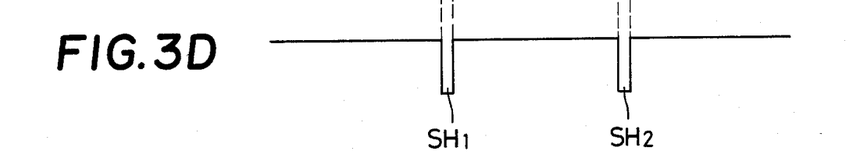

A positive differentiating pulse is applied to the base of transistor 86 at the leading edge of each carrier clock pulse for a period determined by the time constant of the differentiating circuit C3, R3, thereby turning on transistor 86. A negative hold pulse SH1 as shown in FIG. 3D is then applied to the gate of FET 82, turning it off. Accordingly, the previous charge accumulated in holding capacitor C1 is supplied to output terminal 90, as indicated by the dotted line a in FIG. 3C.

The pulse forming circuit 84 comprises a switching diode D connected to the gate of FET 82. The carrier clock signal is supplied to the cathode of the diode D through a second differentiating circuit consisting of a capacitor C2 and a resistor R1. A negative differentiating pulse is applied to the cathode of the diode D at the trailing edge of each carrier clock pulse for a period determined by the time constant of the second differentiating circuit, thereby turning on the diode D. A negative hold pulse SH2 shown in FIG. 3D is then applied to the gate of FET 82, thus disabling it. Accordingly, the charge accumulated in capacitor C1 is supplied to output terminal 90, as indicated by dotted line b in FIG. 3C.

As a result of the foregoing, an output can be obtained from output terminal 90 from which the carrier noise component has been removed. The pulse width (holding interval) of the hold pulses SH1 and SH2 may be set from one to several microseconds depending upon the characteristics of the transmission system. The pulse width of these hold pulses is determined by the first and second differentiating circuits as described above. The sample-and-hold capacitor C1 has a capacitance such as to provide a sufficient time constant to cover the holding interval, depending upon the input impedance of the following circuit. Thus, the capacitance of the capacitor C1 may vary from several hundred to several thousand picofarads. In the non-holding or sampling mode wherein FET 82 is kept ON, the discharge time constant of the capacitor C1 is very small. This prevents formation of a low pass filter with a large time constant, resulting in a wide transmission band.

A multiplex (MPX) terminal 92 is connected to the gate of the FET 82. When a multiplex select signal is applied to terminal 92, the FET 82 will function as a multiplex switch. In the multiplex mode, a plurality of isolation amplifiers, as shown in FIG. 1, are connected in parallel and their respective output terminals 90 are connected together. When a high level signal is applied to the MPX terminal 92 of one of the isolation amplifiers, or the terminal is unconnected, the FET 82 is turned on. This permits the output of the selected isolation amplifier to be supplied from the common connection. The suppression can then be operated. When a negative potential is applied to the selected terminal 92, its FET 82 is forcibly turned off and this channel cannot be selected.

Figure 4:
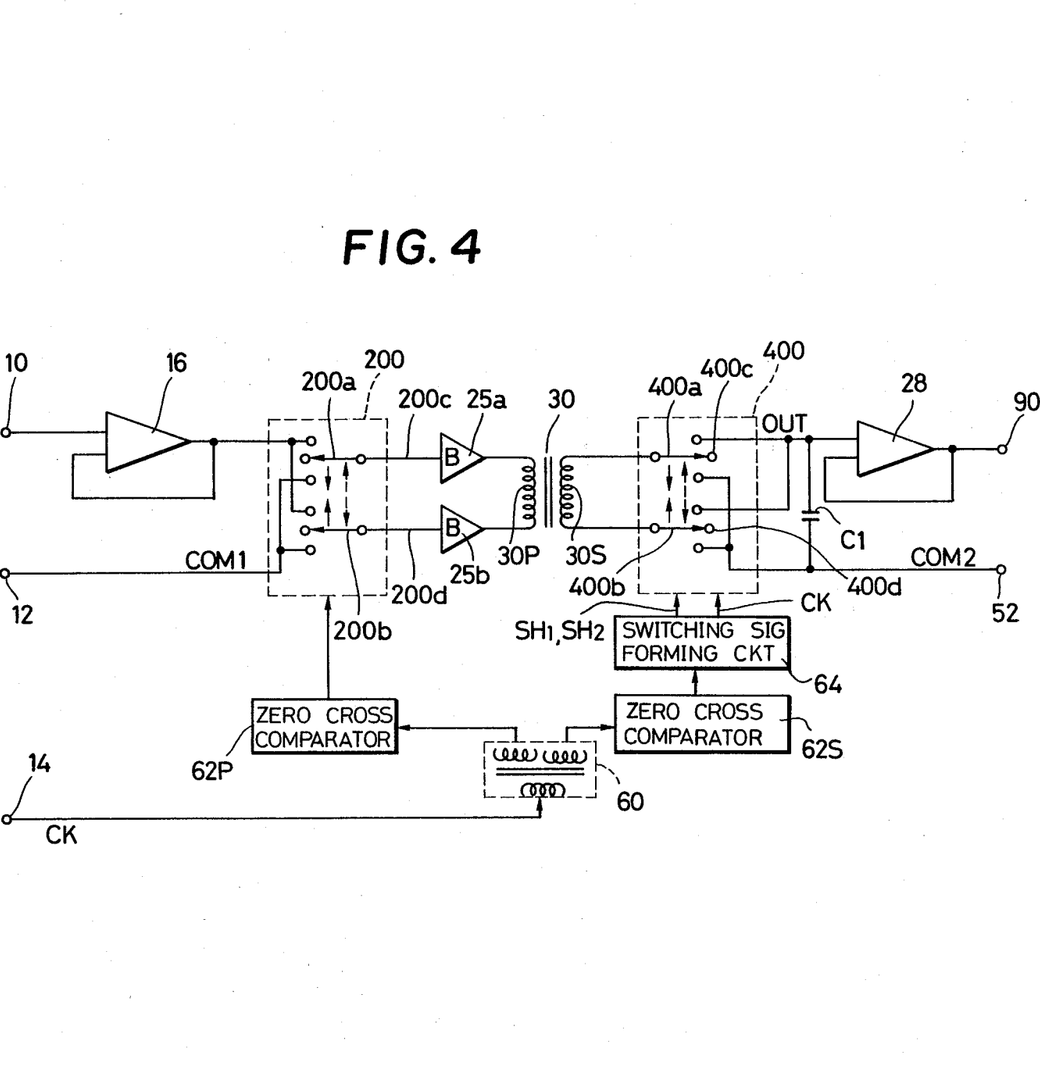
FIG. 4 is a circuit diagram illustrating an isolation amplifier in accordance with a second embodiment of the present invention.

Referring now to the modified isolation amplifer of FIG. 4, the signal of FIG. 2A is supplied to a switching modulator 200 through a voltage follower 16 from an input terminal 10. The switching modulator 200 is of the double-pole, double-throw type and is alternately switched between a signal input side and a common side (COM1) at intervals of one half period of the carrier clock signal shown in FIG. 2B. COM1 is connected to the grounded signal source terminal 12. The switch poles 200a, 200b of modulator 200 are operated in opposite phase, as indicated by the solid and dotted arrow. Thus, the modulated signal shown in FIG. 2C flows in the primary winding of an isolation transformer 30 coupled between the outputs 200c and 200d.

Switching modulator 200 is schematically shown in FIG. 4 as a double-pole, double-throw switch. In actuality it may be an integrated circuit employing FETs. In this case, the ON resistances of the respective switching elements may be several hundred ohms. For this reason, buffer amplifiers 25a and 25b are inserted between the leads of the primary winding 30P of the transformer 30 and the respective outputs 200c and 200d. This prevents the ON resistance and the inductance of the primary winding 30P from forming an undesirable LR time constant circuit. With this arrangement, the impedance of the input signal source with respect to the primary winding 30P of the transformer 30 is very small, as is the time constant, and amplitude distortion and phase delay of the signal are reduced. This permits the frequency of the carrier clock to be further increased and a wider transmission band characteristic can be obtained.

The output signal obtained from secondary winding 30S of the transformer 30 is applied to a switching demodulator 400 and is synchronously rectified employing the same carrier clock signal (FIG. 2B) as on the modulation side. The switching demodulator 400 is of the same type as, and is symmetrically arranged with respect to, the modulatof 200. A pair of switches 400a and 400b, constituting the demodulator 400, are alternately switched between a signal output side (OUT) and a common side (COM2) in opposite phase as indicated by the solid and dotted arrows. COM2 is the ground line of the transmission output side connected to common terminal 52. In this fashion, the original input signal of FIG. 2A is obtained by demodulation and applied to output terminal 90 through voltage follower 28.

The demodulator 400 of FIG. 4 is arranged to suppress the carrier leakage Ca shown in FIG. 3C. Switches 400a and 400b of demodulator 400 have neutral contacts which are connected respectively to the demodulation output side (OUT) and the common side (COM2). A holding capacitor C1 is connected between the output terminal OUT and the common line COM2 of demodulator 400.

The carrier clock signal CK shown in FIG. 3A and hold pulses SH1 and SH2 shown in FIG. 3D are supplied from a switching signal forming circuit 64 to a carrier input to demodulator 400. Hold pulses SH1 and SH2 are in synchronism with the leading and trailing edges of the pulses of carrier clock signal CK. During the periods of the hold pulses SH1 and SH2, switches 400a and 400b of the demodulator 400 are connected, respectively, to the neutral contacts 400c and 400d. During this period, the charge previously accumulated in the holding capacitor C1 is delivered to the output terminal 90 as indicated by dotted lines a and b in FIG. 3C. As a result, there is obtained from terminal 90 an output from which the carrier noise component Ca has been removed.

When the demodulator 400 employs active switching elements, the mechanical neutral contacts 400c and 400d do not in fact exist. The periods during which the switches are connected to the neutral contacts correspond to the period during which the switching elements are turned off by the hold pulses SH1 and SH2.

In the FIG. 4 embodiment the duty cycle of the carrier clock signal of FIG. 2B which drives the modulator 200 and demodulator 400 is precisely adjusted at fifty percent. In this manner, noise and distortion, which are alternately introduced out of phase at a period half that of the carrier clock period, cancel each other, thus providing a high S/N ratio and low distortion. If the duty cycle of the carrier clock signal shifts away from fifty percent, noise components can readily occur in the output, the distortion free region is limited, and the linear dynamic range is degraded. Also, when the duty cycle shifts from fifty percent, any asymmetrical characteristics of the pair of switches constituting the modulator or demodulator undesirably influence the output and increase the carrier leakage in the output signal.

In the embodiment of FIG. 4, in order to maintain the dury cycle of the carrier clock signal CK at fifty percent, a zero crossing comparator is used. The carrier clock signal from clock input terminal 14 is supplied to a distribution transformer 60 having isolated secondary windings. The windings result in isolated clock signals being supplied to each of the modulation and demodulation sides. The respective clock signals are sliced or clipped at ground threshold levels by zero crossing comparators 62P and 62S. Thereafter the clock signals are shaped into signals having fifty percent duty cycles and are supplied, respectively, to the modulator 200 and to the switching signal forming circuit 64 for driving demodulator 400.

By means of the foregoing arrangement, if the input clock signal CK has a distorted waveform, or if it has a reduced amplitude (several millivolts) due to a long transmission path, carrier clock signals having a duty cycle of fifty percent can still be obtained. Since the active switching elements of the modulator 200 or demodulator 400 can be turned completely on and off by using the shaped carrier clock signals, the switching operation can be performed with high efficiency, thereby reducing carrier leakage and transmission distortion. Therefore, even if the capacitance of holding capacitor C1 is small, the desired result may be obtained.

The clock signal CK from terminal 14 is transmitted to the input and output sides of the isolation amplifier by the distribution transformer 60. The carrier clock signals are then reproduced by the respective demodulators by zero crossing detection. In this manner, a common clock system can be provided which is not influenced by differences between the ground reference levels at different parts of the system.

Figure 5:
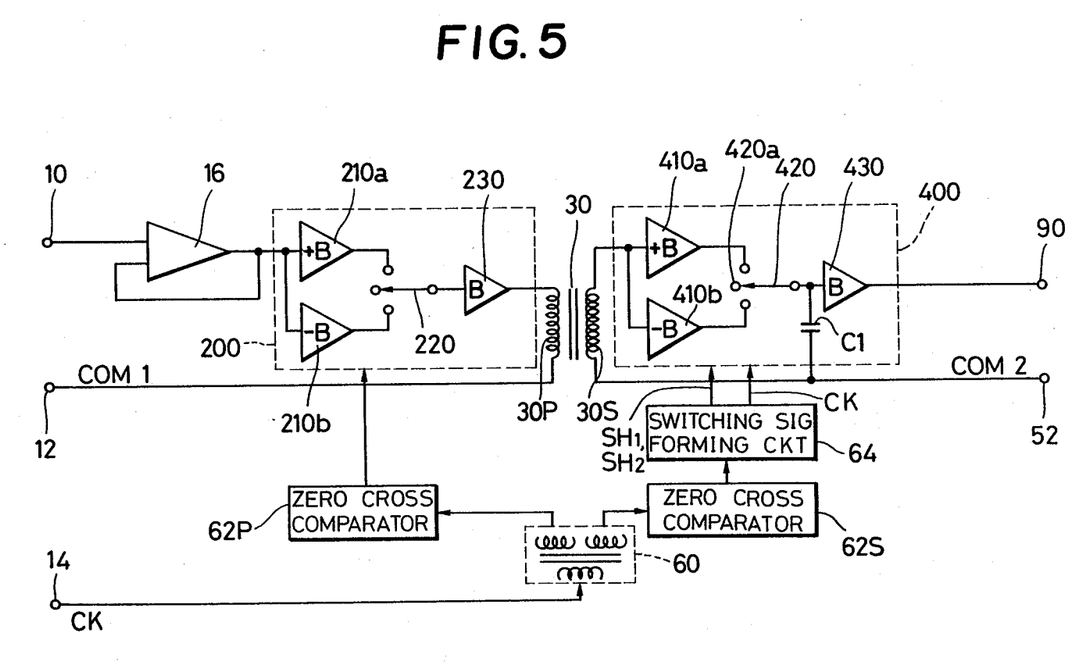
FIG. 5 is a circuit diagram of an isolation amplifier in accordance with a third embodiment of the present invention.

FIG. 5 illustrates an isolation amplifier in accordance with a third embodiment of the present invention. The isolation amplifier of FIG. 5 has the same structure as that illustrated in FIG. 4 except for the arrangement of the pulse modulator 200 and pulse demodulator 400 and similar reference numerals denote similar parts.

The pulse modulator 200 comprises input amplifiers 210a and 210b having positive and negative gains +B and −B, which receive in common the signal of FIG. 2A. Accordingly, absolute values of the gains of the respective input amplifiers 210a and 210b are set at the same value. The outputs of the input amplifiers 210a and 210b are selected alternately at each half period of the carrier clock signal CK by means of a switch 220. The output of the switch 220 is supplied to the primary winding 30P of an isolation transformer 30 through a buffer amplifier 230. Thus, a double-balanced modulated current as shown in FIG. 2C is caused to flow in the primary winding 30P.

The modulator 200 consisting of the input amplifiers 210a, 210b, the buffer amplifier 230, and the switch 220 can be an integrated arrangement using FETs as in the case of FIG. 4. When using such an arrangement, the ON resistance of the equivalent of switch 220 may be large. However, the existence of the buffer amplifier 230 between the switch 220 and the primary winding 30P reduces the time constant of the circuit to increase the carrier frequency.

The output of the secondary winding 30S of the transformer 30 is demodulated (i.e., synchronously rectified) by the demodulator 400 and supplied to the output terminal 90. The demodulator 400 comprises input amplifiers 410a and 410b having positive and negative gains +B and −B of the same absolute value. The outputs from the amplifiers 410a and 410b are selected alternately by a switch 420 which is in synchronism with a carrier clock signal CK. The selected output can be synchronously rectified. The positive pulses of the modulated waveform shown in FIG. 3B which are transmitted to the transformer 30 remain unchanged but the negative pulses are inverted, thereby reproducing the original waveform as shown in FIG. 3C. This is a result of the carrier signals in both the modulation and demodulation portions being in phase. The demodulated output from switch 420 is connected to the output terminal 90 through a buffer amplifier 430.

In the same manner as described with reference to FIG. 4, the switch 420 of the demodulator 400 is provided with a neutral contact 420a which is unconnected, in addition to switching contacts which are connected to outputs of the input amplifiers 410a and 410b. A holding capacitor C1 is connected between the output of the switch 420 and a common line COM2. This switch 420 is controlled by the output of a switching signal forming circuit 64 in the same manner as FIG. 4 and is connected to the neutral contact 420a during the hold pulse intervals SH1 and SH2. As a result, the previous charge accumulated in the hold capacitor C1 is delivered to the output terminal 90 through the buffer amplifier 430, thereby compensating for carrier leakage as indicated by dotted lines a and b in FIG. 3C.

In the embodiment of FIG. 5, the modulator 200 and the demodulator 400 have similar arrangements. The same integrated circuits can be used in both the modulator and demodulator, thereby considerably reducing manufacturing costs. Furthermore, similar amplifiers may be employed for the output buffer amplifier 230, used for impedance matching in modulator 200, and the buffer amplifier 430 in the demodulator 400. The voltage follower 28 which serves as a line output amplifier in the FIG. 4 embodiment is then not needed, thus simplifying the circuit configuration.

Furthermore, in the embodiment of FIG. 5, since the switches 220 and 420 of the modulator 200 and the demodulator 400 are of the same type, undesirable influences resulting from asymmetrical switching characteristics are reduced.

When the modulator 200 and the demodulator 400 are integrated circuits, an integrated circuit terminal may be employed to connect the holding capacitor C1 to the output terminal of the switch 420.

Although preferred embodiments of the invention have been described hereinabove in detail, it is desired to emphasize that this is for the purpose of illustrating the principles of the invention, and is not necessarily limiting of the invention since it is apparent that those of skill in that art can modify the disclosed arrangements in various ways to suit the needs of particular applications.

What is claimed is:

1. An isolation amplifier comprising:
   an isolation transformer;
   switching type balanced modulator means for delivering to the input of said isolation transformer a square wave carrier modulated by an input signal;
   demodulator means for reproducing the input signal by inverting alternate ones of the positive and negative pulses from the output of said isolation transformer;
   a holding capacitor coupled to the output of said demodulator means;
   switch means interposed to prevent the demodulated output signal of said demodulator from being delivered to said capacitor during each discontinuous gap between the edges of said positive and negative pulses; and
   a pulse forming circuit connected to turn off said switch means and place said holding capacitor in a holding state during the period of such discontinuity to supply the charge previously stored therein.

2. An amplifier according to claim 1, wherein said first switching element comprises a transistor which is turned on by the positive differentiated pulse in response to the leading edge transition of the square wave carrier to off-bias the gate of said field effect transistor for a predetermined period of time.

3. An amplifier according to claim 1, wherein the time constants of said first and second differentiating circuits are selected to generate differentiated pulses corresponding to the width of the discontinuity.

4. An amplifier according to claim 2, wherein a multiplex selection control input terminal is connected to the gate of said field effect transistor to operate said field effect transistor to select its amplifier output from those of other isolation amplifiers connected in parallel therewith.

5. An isolation amplifier comprising:
   an isolation transformer;
   switching type balanced modulator means for delivering to the input of said isolation transformer a square wave carrier modulated by an input signal;
   demodulator means for reproducing the input signal by inverting alternate ones of the positive and negative pulses from the output of said isolation transformer;
   a holding capacitor coupled to the output of said demodulator means;
   a field effect transistor inserted between the output of said demodulator means and said holding capacitor with its source and drain connected in series with the output of said demodulator means;
   a first differentiating circuit for forming a positive differentiated pulse in response to a leading edge transition of the square wave carrier;
   a first switching element which is turned on in response to the output of said first differentiating circuit to turn off said field effect transistor;
   a second differentiating circuit for forming a negative differentiated pulse in response to a trailing edge transition of the square wave carrier; and
   a second switching element: which is turned on in response to the output of said second differentiating circuit to turn off said field effect transistor, whereby the charge of said holding capacitor is controlled to maintain the previous value at each discontinuous gap between the edges of said positive and negative pulses.

6. An isolation amplifier comprising:
   an isolation transformer;
   switching type balanced modulator means for delivering to the input of said isolation transformer a square wave carrier modulated by an input signal;
   switching type demodulator means including switch means having a neutral condition in which no output is derived, for reproducing the input signal by inverting alternate ones of the positive and negative pulses from the output of said isolation transformer;
   a holding capacitor coupled to the output of said demodulator means; and
   a pulse forming circuit for forming a holding pulse to place the switch means in its neutral condition in synchronism with the square wave carrier to discharge said holding capacitor during each discontinuity between the edges of said positive and negative pulses.

7. An amplifier according to claim 6, wherein said demodulator means comprises first and second switching circuits having, respectively, first and second switching positions; means connecting respective inputs of said first and second switching circuits to opposite ends of the secondary winding of said isolation transformer; means for switching said first switching circuit to a first position connected to an output terminal of said demodulator means and switching said second switching circuit to a second position connected to a common terminal of said demodulator means during the first half of a carrier cycle; means for switching said first switching circuit to its second position connected to said common terminal and switching said second switching circuit to its second position connected to the output terminal during the second half of the carrier cycle; and each of said first and second switching circuits having a neutral switching position.

8. An amplifier according to claim 7, wherein said modulator means comprises first and second switching circuits substantially symmetrical with respect to those of said demodulator means; respective outputs of said first and second switching circuits being connected to the two ends of the primary winding of said isolation transformer; means for connecting the input of said first switching circuit to an input terminal of said modulator means and an input of said second switching circuit to a common terminal of said modulator means during the first half of a carrier cycle; and means for connecting the input of said first switching circuit to said common terminal and the input of said second switching circuit to the input terminal during the second half of the carrier cycle.

9. An amplifier according to claim 8, wherein said modulator means and said demodulator means respectively comprise electronic switching elements, and wherein a buffer amplifier is between each switching circuit output of said modulator means and one end of said primary winding of said isolation transformer.

10. An amplifier according to claim 6, wherein the square wave carrier is supplied to said modulator means and said demodulator means through a zero crossing comparator.

11. An amplifier according to claim 6, wherein said demodulator means comprises a pair of input amplifiers connected to transmit the output of said isolation transformer at the same gain but with opposite polarities, and a switching circuit having two switching positions for switching the outputs of said pair of input amplifiers in synchronism with the square wave carrier to derive a demodulation output, said switching circuit having a neutral position at which no output is derived.

12. An amplifier according to claim 11, wherein a buffer amplifier is coupled to the output of said switching circuit.

13. An amplifier according to claim 12, wherein said modulator means is symmetrical with said demodulator means including said pair of input amplifiers, said switching circuit, and said buffer amplifier; means for supplying an input signal to a common terminal of said pair of input amplifiers, and means for supplying the output from said switching circuit to the primary winding of said isolation transformer through said buffer amplifier.

* * * * *